(12) United States Patent
Chen et al.

(10) Patent No.: US 11,339,100 B2
(45) Date of Patent: May 24, 2022

(54) GRADED COATING OF ELEMENT DIFFUSION INHIBITION AND ADHESION RESISTANCE ON MOLD FOR GLASS MOLDING

(71) Applicants: No. 59 Institute of China Ordnance Industry, Chongqing (CN); University of Science and Technology Liaoning, Liaoning (CN); Shenzhen University, Shenzhen (CN)

(72) Inventors: Qiang Chen, Chongqing (CN); Zhiwen Xie, Liaoning (CN); Feng Gong, Shenzhen (CN); Xinfang Huang, Liaoning (CN); Kangsen Li, Shenzhen (CN); Yuanyuan Wan, Chongqing (CN)

(73) Assignees: No.59 Institute of China Ordnance Industry, Chongqing (CN); University of Science and Technology Liaoning, Anshan (CN); Shenzhen University, Shenzhen (CN)

( * ) Notice: Subject to any disclaimer, the term of this patent is extended or adjusted under 35 U.S.C. 154(b) by 346 days.

(21) Appl. No.: 16/579,807

(22) Filed: Sep. 23, 2019

(65) Prior Publication Data

US 2020/0331798 A1 Oct. 22, 2020

(30) Foreign Application Priority Data

Apr. 17, 2019 (CN) .......................... 201910309244.0

(51) Int. Cl.
*C04B 41/50* (2006.01)
*C04B 41/52* (2006.01)
(Continued)

(52) U.S. Cl.
CPC ...... *C04B 41/5062* (2013.01); *C23C 14/0036* (2013.01); *C23C 14/022* (2013.01); *C23C 14/025* (2013.01); *C23C 14/0641* (2013.01); *C23C 14/165* (2013.01); *C23C 14/352* (2013.01); *C03B 11/086* (2013.01); *C03B 2215/12* (2013.01); *C03B 2215/22* (2013.01); *C03B 2215/31* (2013.01);
(Continued)

(58) Field of Classification Search
CPC .................................................. C04B 41/5062
See application file for complete search history.

(56) References Cited

U.S. PATENT DOCUMENTS

2005/0268662 A1* 12/2005 Moore .................. C23C 14/025
65/374.11
2010/0180635 A1* 7/2010 Fukumoto ............. C03B 11/082
65/26

OTHER PUBLICATIONS

Gong Feng, Li Kang-sen, Yan Chao. Progress on precision glass molding[J]. Optics and Precision Engineering, 2018, 26(6): 1380.
(Continued)

*Primary Examiner* — David Sample (57) ABSTRACT

Disclosed are coatings made of inorganic materials on molds for glass molding, particularly, a graded coating of element diffusion inhibition and adhesion resistance on molds for glass molding. The graded coating includes a Cr adhesion layer which is bonded with a substrate, a CrN intermediate layer and a $Cr_xW_yN_{(1-x-y)}$ surface layer, where $0.15<x<0.4$, and $0.2 \leq y<0.45$. The graded coating has excellent crack growth suppression and adhesion resistance.

10 Claims, 6 Drawing Sheets

(51) Int. Cl.
   *C04B 41/87* (2006.01)
   *C04B 41/88* (2006.01)
   *C04B 41/90* (2006.01)
   *C23C 14/16* (2006.01)
   *C23C 14/35* (2006.01)
   *C23C 14/00* (2006.01)
   *C23C 14/06* (2006.01)
   *C23C 14/02* (2006.01)
   *C03B 11/08* (2006.01)

(52) U.S. Cl.
   CPC ...... *C03B 2215/32* (2013.01); *C03B 2215/34* (2013.01); *C04B 41/52* (2013.01); *C04B 41/90* (2013.01); *C23C 14/0084* (2013.01)

(56) References Cited

OTHER PUBLICATIONS

Wang Lirong. Optical Glass Molding Technology[J]. Science & Technology Communication, 2012(7): 105.
Wu Cheng. Research on the Manufacturing of Optical Glass by Precision Molding Technology[J], Market Weekly, Theoretical Research, 2012(02): 111.
Wei Yu-ping, Chen Yong. Development and application of materials for glass Mould[J]. Machinery Design and Manufacture, 2008(3):201.
Xiao Ming. Development and Application of Mould Materials for High-Tech Glasses [J]. Glass & Enamel, 2006, 34 (2):19.

* cited by examiner

GRADED COATING OF ELEMENT DIFFUSION INHIBITION AND ADHESION RESISTANCE ON MOLD FOR GLASS MOLDING

CROSS-REFERENCE TO RELATED APPLICATIONS

This application claims the benefit of priority from Chinese Patent Application No. CN201910309244.0, filed on Apr. 17, 2019. The content of the aforementioned application, including any intervening amendments thereto, is incorporated herein by reference in its entirety.

TECHNICAL FIELD

This application relates to coatings made of inorganic materials on molds for glass molding, particularly to a graded coating of element diffusion inhibition and adhesion resistance on mold for glass molding.

BACKGROUND OF THE INVENTION

Precision glass molding, a high-efficiency and green optical element manufacturing technique, has been rapidly developed in recent years (Feng GONG et al., Development of Precision Glass Molding, *Optics and Precision Engineering*, 2018, 26(6), p 1380, Abstract, publication date: Jun. 30, 2018). Due to the thermal-processing property that the glass transition between the molten state to the solid state is continuous and reversible, in the optical glass molding method, the glass and the mold are heated and pressurized without oxygen around the glass transition temperature Tg to mold the optical glass at one time. Traditional processes, such as coarse grinding, fine grinding, polishing and centering and edging, are eliminated, so the optical glass molding method greatly saves materials, time, equipment and manpower. In addition, optical elements of complicated shapes can be molded, and particularly, it has wide application prospects in manufacturing aspheric optical glass parts, small and micro optical elements (Lirong WANG, Optical Glass Molding Technique, *Public Communication of Science & Technology*, 2012(7), p 105, publication date: Jul. 23, 2012). Therefore, the optical glass molding technique is specially suitable for mass production of various high-precision, medium and small-diameter lens with special structures, particularly those that are hard to realize by traditional processing methods, such as small-diameter thin lens, high-order aspheric lens, micro lens arrays and diffractive optical elements and freeform optical elements, etc. The application of the aspheric glass elements is advanced by the optical glass molding technique that enables the mass production of precision aspheric or freeform optical elements (Cheng W U, Research on Precision Molding Technique in Optical Glass Manufacturing, *Market Weekly: Theoretical Research*, 2012(2), p 111, publication date: Jun. 1, 2012).

However, in the molding process of glass products, the mold frequently contacts with the high-temperature molten glass, causing the synergistic effects, such as oxidation reaction, thermal fatigue, dynamic wear, adhesion, so that the service life and surface quality of the mold have always limited the development of precision glass molding technique (Yuping W E I et al., Development and Application of Materials for Glass Mold, *Machinery Design & Manufacture*, 2008(3), p 201, publication date: Mar. 31, 2008; Ming XIAO, Development and Application of mold Materials for High-Tech Glasses, *Glass & Enamel*, 2006, 34(2), p 19, publication date: Apr. 30, 2006). In addition, the surface quality of the mold is closely related to the forming quality of glass components. Therefore, the mold for glass molding is required to have excellent properties for resisting high temperature, oxidation, adhesion, thermal fatigue, corrosion and wear.

Therefore, a method of coating the mold surface is employed to improve the mold properties for resisting high temperature, oxidation, adhesion, thermal fatigue, corrosion and wear, etc. to extend the service life and improve the quality of the optical elements. However, due to the lack of mold coating, the main mold processing methods are traditional CNC cutting, grinding, polishing, etc in China. Thus, a coating of elements diffusion inhibition and adhesion resistance on a mold for glass molding is urgently needed.

SUMMARY OF THE INVENTION

In view of the above, an object of the present invention is to provide a graded coating on a mold for glass molding, which has excellent properties of element diffusion inhibition and adhesion resistance, and are low in cost.

The present invention adopts the following technical solutions to achieve above objects.

A graded coating on a mold for glass molding, comprising:
a Cr adhesion layer which is bonded with a substrate;
a CrN intermediate layer; and
a $Cr_xW_yN_{(1-x-y)}$ surface layer,
wherein $0.15<x<0.4$, and $0.2\leq y<0.45$.

In some embodiments, a thickness of the Cr adhesion layer is 50-100 nm, a thickness of the CrN intermediate layer is 150-300 nm, a thickness of the $Cr_xW_yN_{(1-x-y)}$ surface layer is 1300-1500 nm.

In some embodiments, a wetting angle of the graded coating at 1000° C. is 125°.

In some embodiments, the substrate is a tungsten carbide mold doped with 8% by mass of Co.

In a second aspect, provided is a method for preparing the graded coating on the mold of glass molding, comprising:

(A) performing sputter cleaning on the substrate and target materials in a vacuum and an inert gas;

(B) in a vacuum and an inert gas, depositing, with a Cr target and a W target, the Cr adhesion layer, the CrN intermediate layer and the $Cr_xW_yN_{(1-x-y)}$ surface layer successively on a surface of the substrate treated in step (A).

In some embodiments, the inert gas is selected from argon, nitrogen or a mixture thereof.

In some embodiments, in step (A), a flow rate is 100-180 sccm; a vacuum degree for the sputter cleaning is 0.4-0.5 pa; the substrate is preheated to 200-400° C., preferably 300-400° C.; a bias voltage for deposition is −30∼−70 V; a time for the sputter cleaning of the substrate is 30-120 min, preferably 60-120 min; a time for the sputter cleaning of the target materials is 1-5 min, preferably 2-5 min.

In some embodiments, in step (B), when depositing the Cr adhesion layer, a vacuum degree for the substrate in a vacuum chamber is $3\times10^{-3}$-$6\times10^{-3}$ Pa; a working gas is argon; a vacuum degree of a reaction chamber is 0.4-0.5 Pa; a bias voltage for deposition is −30∼−70 V; a power for the Cr target is 3-6 kW; a deposition temperature is 300-400° C.; a deposition time is 2-5 min.

In some embodiments, in step (B), when depositing the CrN intermediate layer, a working gas is a mixture of argon and nitrogen; a vacuum degree for sputter cleaning is 0.4-0.5 Pa; a bias voltage is −30∼−70 V; a power for the Cr target is 3-6 kW; a deposition temperature is 300-400° C.; and a deposition time is 20-40 min.

In some embodiments, in step (B), when depositing the $Cr_xW_yN_{(1-x-y)}$ surface layer, a working gas is a mixture of argon and nitrogen; a vacuum degree for sputter cleaning is 0.4-0.5 Pa; a bias voltage is −30∼−70 V; a power for the Cr target is 3-6 kW, a power for the W target is 4-6 kW; a deposition temperature is 300-400° C.; and a deposition time is 60-100 min.

In some embodiments, the deposition employs a plasma enhanced magnetron sputtering.

In some embodiments, the method for preparing the graded coating comprises: before step A,
(1) polishing the substrate;
(2) ultrasonically cleaning the polished substrate in deionized water and/or acetone and/or ethanol.

In some embodiments, the target materials are covered by a lining board during the sputter cleaning.

In a third aspect, provided is an application of the graded coating, comprising applying the graded coating to the preparation of a mold for glass molding.

In a fourth aspect, provided is a mold for glass molding, comprising a graded coating comprising a Cr adhesion layer bonded with a substrate, a CrN intermediate layer and a $Cr_xW_yN_{(1-x-y)}$ surface layer, wherein $0.15<x<0.4$, and $0.2\le y<0.45$.

In some embodiments, the substrate is a tungsten carbide mold doped with 8% by mass of Co.

The present invention has the following beneficial effects.

Clusters of different sizes, fine cracks and pores are distributed on the coating surface. The cross section of the coating is columnar, and the coating and the substrate are closely combined.

The graded coating with good mechanical properties reaches the hardness standard for the coating on molds for glass molding.

The coating surface has a low roughness exhibiting good surface finishing, which is suitable for the coating on molds for the precision glass molding coating.

The graded coating has excellent properties of high temperature resistance and adhesion resistance during molding. After the molding, the glass and the surface of the mold coating have no significant changes. Specifically, the color of the glass is not changed and no bubble is generated; the mold surface has no adhered glass; and no peeling appears on the contacting part between the coating surface and the glass.

The graded coating has excellent properties of high temperature resistance and adhesion resistance.

The graded coating has an excellent property of crack growth suppression.

The graded coating is low in cost.

DETAILED DESCRIPTION OF EMBODIMENTS

The embodiments are intended to better illustrate but not to limit the present invention. Therefore, non-substantial improvements and adjustments to the embodiments based on above-mentioned inventions by those skilled in the art shall fall within the scope of the present invention.

Example 1

In this embodiment, illustrated is a method for preparing the graded coating on a mold of glass molding, comprising the following steps.

(1) Pre-Treatment

The substrate (a tungsten carbide mold doped with 8% by mass of Co) was mechanically ground and polished, then was ultrasonically cleaned in deionized water, acetone and ethanol in turn for 20 min, respectively, and finally was dried in an oven at 80° C. for 30 min.

(2) Sputter Cleaning

The treated substrate was placed in a vacuum chamber which was pre-vacuumized to a vacuum degree of $5\times10^{-3}$ Pa and heated to 300° C. High-purity argon (purity>99.99%, known from outer packing) was added to perform the ion sputter etching cleaning on the substrate and target materials with a flow rate of 120 sccm, a vacuum degree of 0.4 Pa and a bias voltage of −70 V. A time for the sputter cleaning of the substrate is 5 min, and a time for the sputter cleaning of the target materials is 5 min. The target materials were covered by a lining board during the sputter cleaning.

(3) Deposition of Cr Adhesion Layer

The Cr adhesion layer was deposited on the substrate using a plasma enhanced magnetron sputtering system. During the sputter cleaning, the vacuum degree of the substrate in the vacuum chamber was $5\times10^{-3}$ Pa; the working gas was argon (purity>99.99%, known from outer packing); the target material was a high-purity Cr target (purity>99.9%, known from outer packing); the vacuum degree was 0.4 Pa; the bias voltage was −30 V; the power for the Cr target was 5 kW; the deposition temperature was 300° C.; and the deposition time was 5 min.

(4) Deposition of CrN Intermediate Layer

The CrN intermediate layer was deposited on a surface of the substrate deposited with the Cr adhesion layer using the plasma enhanced magnetron sputtering system. During sputter cleaning, the working gas was a mixture of argon (purity>99.99%, known from outer packing) and nitrogen (purity>99.99%, known from outer packing); the target material was a high-purity Cr target (purity>99.9%, known from outer packing); the vacuum degree was 0.4 Pa; the bias voltage for deposition was −30 V; the power for the Cr target was 5 kW; the deposition temperature was 300° C.; and the deposition time was 20 min.

(5) Deposition of $Cr_xW_yN_{(1-x-y)}$ Surface Layer

The $Cr_xW_yN_{(1-x-y)}$ surface layer was deposited on surface of the substrate deposited with the Cr adhesion layer and the CrN intermediate layer using the plasma enhanced magnetron sputtering system. During the sputter cleaning, the working gas was a mixture of argon (purity>99.99%, known from outer packing) and nitrogen (purity>99.99%, known from outer packing), the target materials were a high-purity Cr target (purity>99.9%, known from outer packing) and a high-purity W target (purity>99.6%, known from outer packing); the vacuum degree was 0.4 Pa, the bias voltage was −30 V; the power for the Cr target was 3 kW; the power for the W target was 4 kW; the deposition temperature was 300° C.; and the deposition time was 60 min.

Example 2

In this embodiment, provided is a method for preparing the graded coating on a mold for glass molding, comprising the following steps.

(1) Pre-Treatment

The substrate (a tungsten carbide mold doped with 8% by mass of Co) was mechanically ground and polished, then was ultrasonically cleaned in deionized water, acetone and ethanol solution in turn for 20 min, respectively, and finally was dried in an oven at 80° C. for 30 min.

(2) Sputter Cleaning

The treated substrate was placed in a vacuum chamber which was pre-vacuumized to a vacuum degree of $5\times10^{-3}$ Pa and heated to 300° C. High-purity argon (purity>99.99%, known from outer packing) was added to perform the ion sputter etching cleaning on the substrate and target materials with a flow rate of 120 sccm, a vacuum degree of 0.4 pa, a bias voltage of −70 V. A time for the sputter cleaning of the substrate is 60 min, and a time for the sputter cleaning of the target materials is 5 min. The target materials were covered by a lining board during the sputter cleaning.

(3) Deposition of Cr Adhesion Layer

The Cr adhesion layer was deposited on the substrate using a plasma enhanced magnetron sputtering system. During the sputter cleaning, the vacuum degree of the substrate in the vacuum chamber was $5\times10^{-3}$ Pa; the working gas was argon (purity>99.99%, known from outer packing); the target material was a high-purity Cr target (purity>99.9%, known from outer packing); the vacuum degree was 0.4 Pa; the bias voltage was −30 V; the power for the Cr target was 5 kW, the deposition temperature was 300° C., and the deposition time was 5 min.

(4) Deposition of $Cr_xW_yN_{(1-x-y)}$ Surface Layer

The $Cr_xW_yN_{(1-x-y)}$ surface layer was deposited on a surface of the substrate deposited with the Cr adhesion layer using the plasma enhanced magnetron sputtering system. During the sputter cleaning, the working gas was a mixture of argon (purity>99.99%, known from outer packing) and nitrogen (purity>99.99%, known from outer packing); the target materials were a high-purity Cr target (purity>99.9%, known from outer packing) and a high-purity W target (purity>99.6%, known from outer packing); the vacuum degree was 0.4 Pa; the bias voltage for deposition was −30 V; the power for the Cr target was 3 kW; the power for the W target was 4 kW; the deposition temperature was 300° C.; and the deposition time was 60 min.

Example 3

In this embodiment, illustrated is a method for preparing a graded coating on a mold for glass molding, comprising the following steps.

(1) Pre-Treatment

The substrate (a tungsten carbide mold doped with 8% by mass of Co) was mechanically ground and polished, then was ultrasonically cleaned in deionized water, acetone and ethanol in turn for 20 min, respectively, and finally was dried in an ovan at 80° C. for 30 min.

(2) Sputter Cleaning

The substrate was placed in a vacuum chamber which was pre-vacuumized to a vacuum degree of 5×10-3 Pa and heated to 300° C. During sputter cleaning, high-purity argon (purity>99.99%, known from outer packing) was added to perform the ion sputter etching cleaning on the substrate and target materials with a flow rate of 120 sccm, a vacuum degree of 0.4 Pa, a bias voltage of −70 V. A time for the sputter cleaning of the substrate was 60 min, and a time for the sputter cleaning of the target materials was 5 min. The target materials were covered by a lining board during sputter cleaning.

(3) Deposition of $Cr_xW_yN_{(1-x-y)}$ Surface Layer

The $Cr_xW_yN_{(1-x-y)}$ surface layer was deposited on a surface of the substrate deposited with the Cr adhesion layer using the plasma enhanced magnetron sputtering system. During the sputter cleaning, the working gas was a mixture of argon (purity>99.99%, known from outer packing) and nitrogen (purity>99.99%, known from outer packing); the target materials were a high-purity Cr target (purity>99.9%, known from outer packing) and a high-purity W target (purity>99.6%, known from outer packing); the vacuum degree was 0.4 Pa; the bias voltage for deposition was −30 V; the power for the Cr target was 4 kW; the power for the W target was 4 kW; the deposition temperature was 300° C., and the deposition time was 60 min.

Performance Test

The coating in the first embodiment is tested in terms of performance such as morphologies of surface and cross section of the coating, hardness, surface roughness, surface elements, phase compositions and wetability at high temperature, and the results are shown in FIGS. 2-8.

The hardness of the coating is tested by nanoindentors using the continuous stiffness measurement (CSM). The depth of nano-indentation is set to 110 nm so as to eliminate the substrate factor on the test result. Five different areas on the sample are selected for testing, and then the hardness and elastic modulus are averaged, so that the accuracy and reliability of the data are ensured.

The roughness of the surface was tested by an atomic force microscope with a sample area of 2×2 μm.

The molding pressure is tested by molding the BK7 optical glass using the self-designed mold for optical non-spherical glass molding (Chinese Patent Application No. 201710124489.7; Chinese Patent Publication No. 106946441 A), where the molding pressure is 0.5 kN; and the molding temperature is 650° C. The morphologies and colors of the BK7 glass and the coating on the mold are observed.

Elements of the coating surface are tested via qualitative analysis using X-ray energy dispersive spectrometer (EDS) of the field emission scanning electron microscope (FE-SEM).

Phase structure of the coating is tested by an X-ray diffractometer, and the crystal structure of the coating is analyzed with small angle diffraction to avoid the factor of the substrate.

Through a high-temperature wetting test, the wettability of the coating at high temperature is examined at a temperature of 1000° C. by using a modified sessile drop method, where the vacuum is $5\times10^{-3}$ Pa, and the glass is BK7 optical glass.

The property of crack growth suppression of the coating is tested by applying a load of 60 N to the coating via a diamond indenter with a conical angle of 120° of a Rockwell hardness tester, and then the surface of the pressed coating was observed by a microscope with ultra depth of field.

Figure 1:
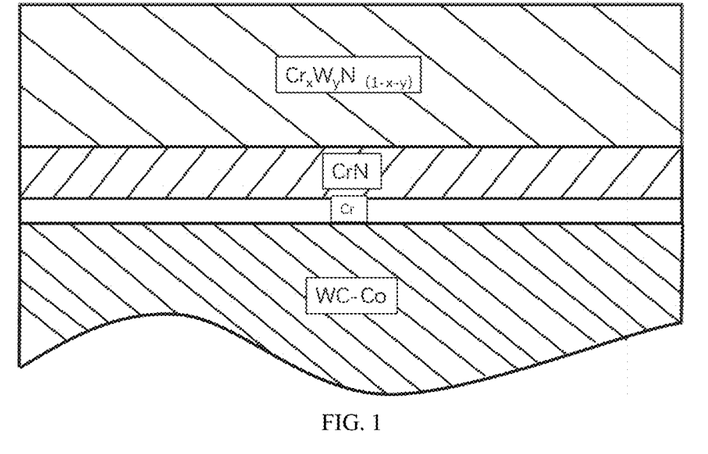
FIG. 1 is a schematic diagram of a graded coating on a mold for glass molding according to an embodiments of the present invention.
Figures 2A, 2B:
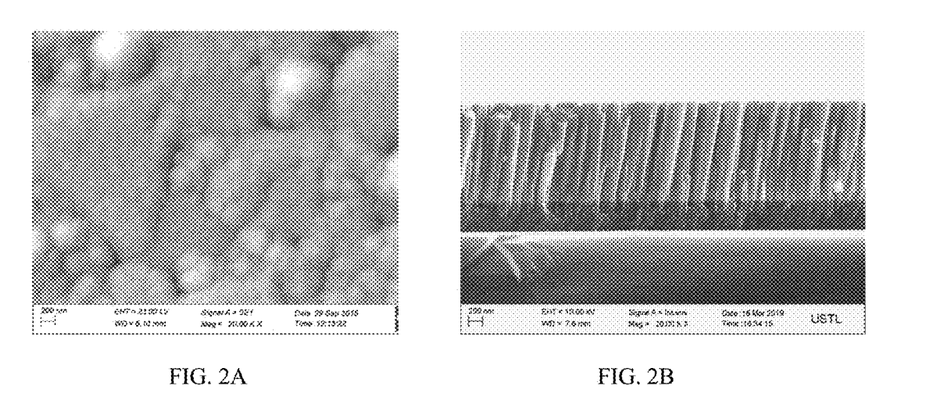
FIGS. 2A-2B are SEM images showing a surface and a cross section of a coating according to a first embodiment.

As shown in FIGS. 2A-B, the surface morphology of the graded coating in Example 1 presents cauliflower clusters of different sizes, and the surface exhibits defects such as small cracks and holes. It is observed from the cross section of the coating that the coating grows in columnar crystal structure, with layers tightly bound together, where the Cr adhesion layer has a thickness of 96 nm; the CrN intermediate layer has a thickness of 297 nm and the $Cr_xW_yN_{(1-x-y)}$ layer has a thickness of 1375 nm.

Figure 3:
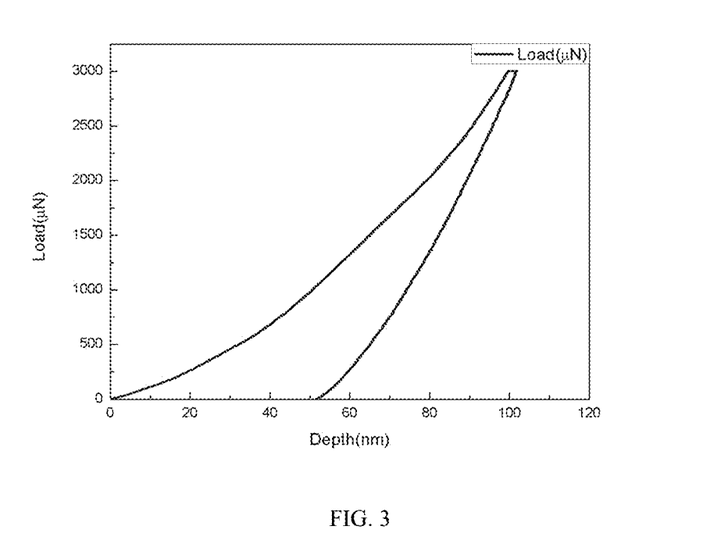
FIG. 3 shows a test result of hardness of the graded coating according to the first embodiment.

As shown in FIG. 3, the coating prepared in Example 1 has a hardness of 16 GPa. Thus, the coating of the invention having good mechanical properties reaches the hardness standard of the coating on the mold for glass molding.

Figure 4:
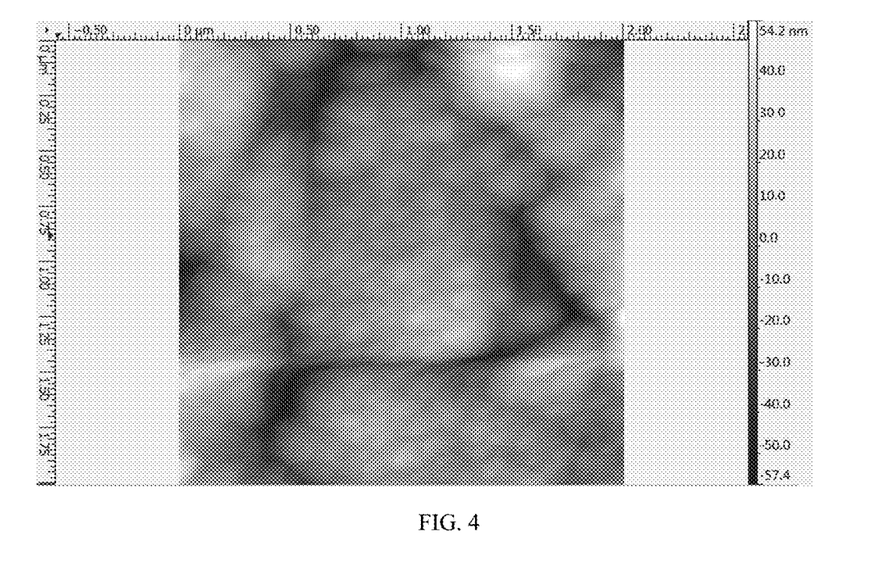
FIG. 4 shows a test result of surface roughness of the graded coating according to the first embodiment.

As shown in FIG. 4, the roughness of the graded coating in Example 1 is 4 nm, representing an excellent surface quality and meeting the use requirements of coating on the mold for precision glass molding.

Figure 5:
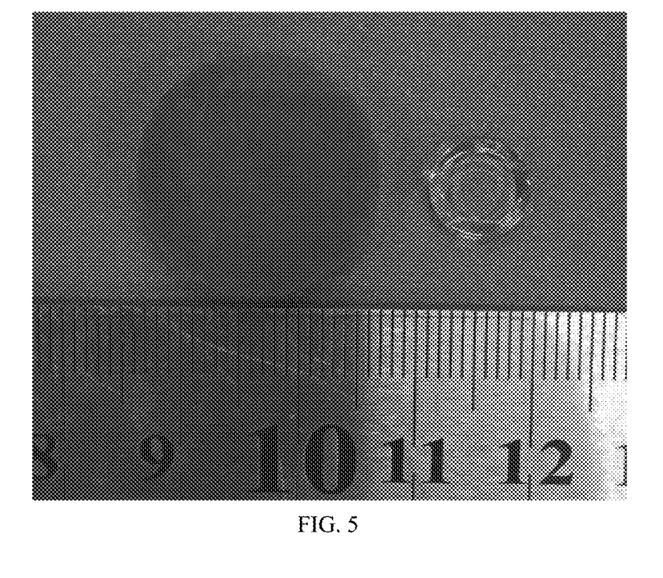
FIG. 5 is an image showing morphologies of surfaces of the graded coating and the glass according to the first embodiment, in which the glass has been molded.

As shown in FIG. 5, after the thermoforming, the glass and the surface of the mold coating have no significant changes. Further, the color of the glass is not changed and no bubble is generated, and the mold surface has no adhered glass. no no peeling appears on the contacting part between the coating surface and the glass. The graded coating in Example 1 shows excellent properties of high temperature resistance and adhesion resistance during molding.

Figure 6:
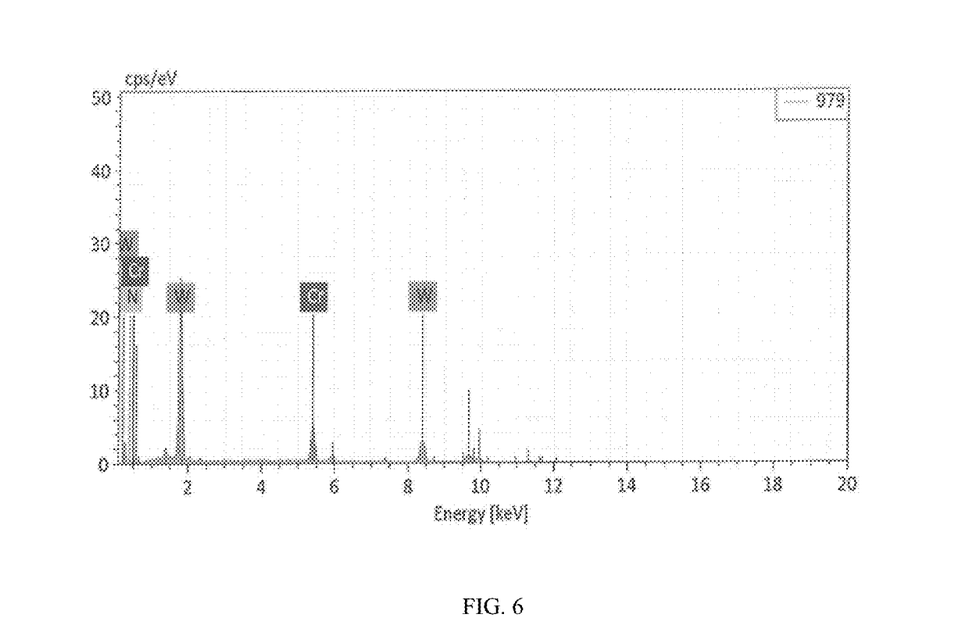
FIG. 6 shows an XRD result of elements of the graded coating according to the first embodiment.

As shown in FIG. 6, the graded coating in Example 1 mainly comprises Cr, W and N elements.

Figure 7:
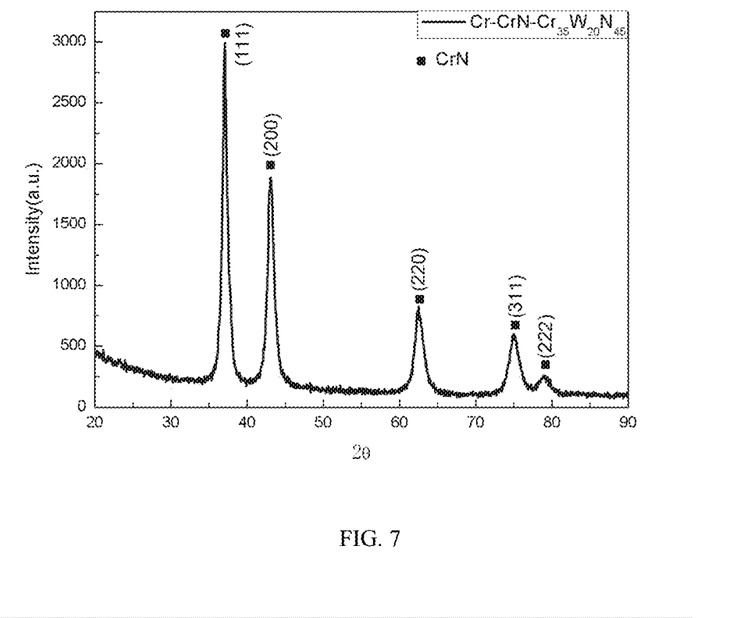
FIG. 7 shows a test result of phase composition of the graded coating according to the first embodiment.

As shown in FIG. 7, the surface layer of the graded coating in Example 1 has significant CrN phase, with main crystal orientations of (111), (200), (220), (311) and (222), containing 35% by mass of Cr, 40% by mass of W, 45% by mass of N.

Figure 8:
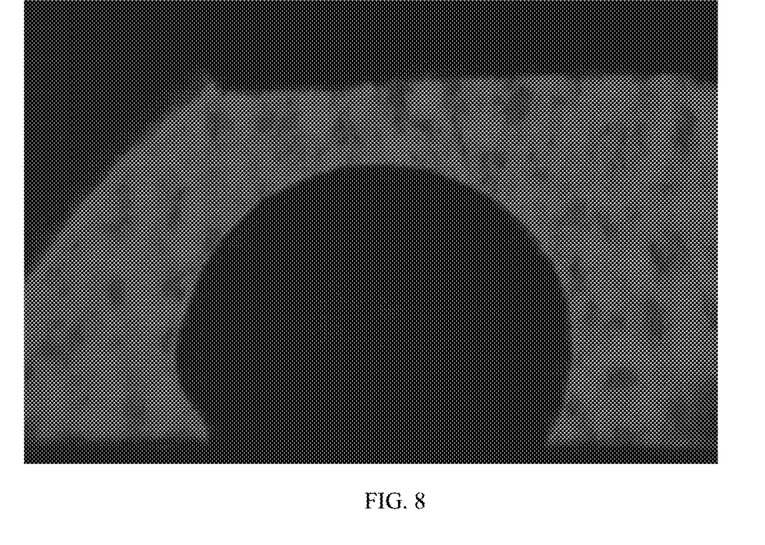
FIG. 8 shows a test result of wettability of the graded coating at high temperature according to the first embodiment.

As shown in FIG. 8, when the coating prepared in Example 1 is in an environment temperature of 1000° C. and a vacuum of $5\times10$ Pa, no spread appears on the surfaces of the molten glass and the coating, and contact angles between the molten glass and the coating at high temperature are 125°. Therefore, the coating of the invention has excellent properties of high temperature resistance and adhesion resistance.

Figure 9A:
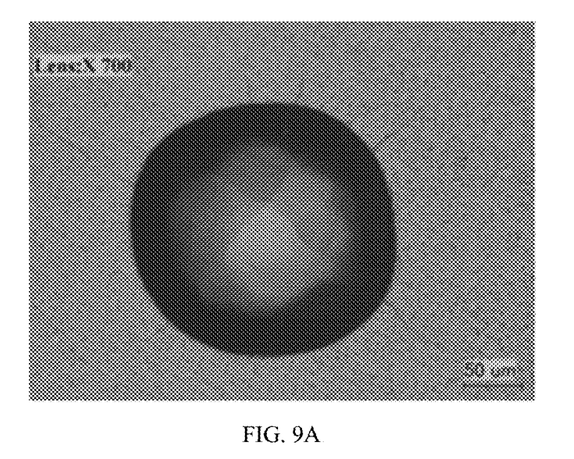
FIG. 9A shows a test result of crack growth suppression of the graded coating according to the first embodiment.
Figure 9B:
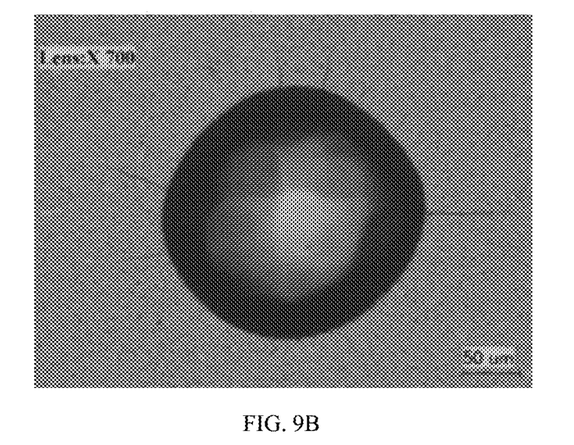
FIG. 9B shows a test result of crack growth suppression of the graded coating according to a second embodiment.
Figure 9C:
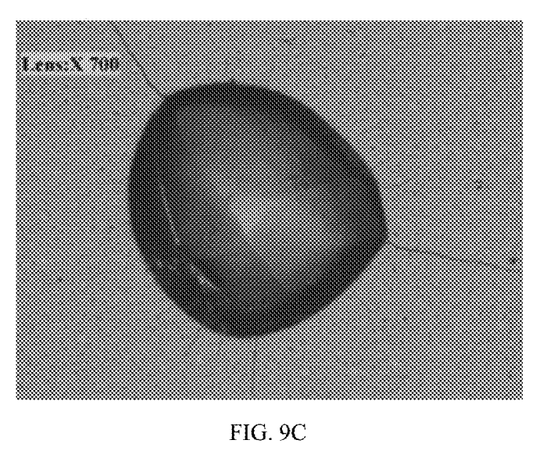
FIG. 9C shows a test result of crack growth suppression of the graded coating according to a third embodiment.

As shown in FIG. 9, compared to the coatings prepared in Examples 2-3, the number of cracks of the graded coating in Example 1 was significantly reduced, demonstrating that the property of crack growth suppression of the graded coating in this invention was significantly improved.

It should be understood that although the embodiments are illustrated in the description for clarity, each embodiment may include more than one technical solution. It is noted that the description should be taken as a whole, and various embodiments can be appropriately combined to form other embodiments that can be understood by those skilled in the art.

What is claimed is:

1. A graded coating on a mold for glass molding, comprising:
   a Cr adhesion layer which is bonded with a substrate;
   a CrN intermediate layer; and
   a $Cr_xW_yN_{(1-x-y)}$ surface layer,
   wherein $0.15<x<0.4$, and $0.2\leq y<0.45$.

2. The graded coating of claim 1, wherein a thickness of the Cr adhesion layer is 50-100 nm; a thickness of the CrN intermediate layer is 150-300 nm; and a thickness of the $Cr_xW_yN_{(1-x-y)}$ surface layer is 1300-1500 nm.

3. The graded coating of claim 1, wherein a wetting angle of the graded coating at 1000° C. is 125°.

4. A method for preparing the graded coating of claim 1, comprising:
   (A) performing sputter cleaning on the substrate and target materials in a vacuum and an inert gas;
   (B) in a vacuum and an inert gas, depositing, with a Cr target and a W target, the Cr adhesion layer, the CrN intermediate layer and the $Cr_xW_yN_{(1-x-y)}$ surface layer successively on a surface of the substrate treated in step (A).

5. The method of claim 4, wherein the inert gas is selected from argon, nitrogen or a mixture thereof.

6. The method of claim 4, wherein in step (A), a flow rate is 100-180 sccm; a vacuum degree for the sputter cleaning is 0.4-0.5 Pa; the substrate is preheated to 200-400° C.; a bias voltage for deposition is −30~−70 V; a time for the sputter cleaning of the substrate is 30-120 min; and a time for the sputter cleaning of target materials is 1-5 min.

7. The method of claim 4, wherein in step (B), when depositing the Cr adhesion layer, a vacuum degree for the substrate in a vacuum chamber is $3\times10^{-3}$-$6\times10^{-3}$ Pa; a working gas is argon; a vacuum degree of a reaction chamber is 0.4-0.5 Pa; a bias voltage for deposition is −30~−70 V; a power for the Cr target is 3-6 kW; a deposition temperature is 300-400° C.; a deposition time is 2-5 min.

8. The method of claim 4, wherein in step (B), when depositing the CrN intermediate layer, a working gas is a mixture of argon and nitrogen; a vacuum degree for the sputter cleaning is 0.4-0.5 Pa; a bias voltage is −30~−70 V; a power for the Cr target is 3-6 kW; a deposition temperature is 300-400° C.; and a deposition time is 20-40 min.

9. An application of the graded coating of claim 1, comprising applying the graded coating to the preparation of a mold for glass molding.

10. A mold for glass molding, comprising: a graded coating comprising a Cr adhesion layer which is bonded with a substrate, a CrN intermediate layer and a $Cr_xW_yN_{(1-x-y)}$ surface layer, wherein $0.15<x<0.4$, and $0.2\leq y<0.45$.

* * * * *